(12) United States Patent
Xi

(10) Patent No.: US 11,930,609 B2
(45) Date of Patent: Mar. 12, 2024

(54) REAR HOUSING AND DISPLAY DEVICE HAVING THE SAME

(71) Applicants: Hefei BOE Vision-Electronic Technology Co.,Ltd., Hefei (CN); BOE Technology Group Co., Ltd., Beijing (CN)

(72) Inventor: Zuoyan Xi, Beijing (CN)

(73) Assignees: Hefei BOE Vision-Electronic Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 422 days.

(21) Appl. No.: 17/311,733

(22) PCT Filed: Dec. 29, 2020

(86) PCT No.: PCT/CN2020/140594
§ 371 (c)(1),
(2) Date: Jun. 8, 2021

(87) PCT Pub. No.: WO2021/184900
PCT Pub. Date: Sep. 23, 2021

(65) Prior Publication Data
US 2023/0363099 A1    Nov. 9, 2023

(30) Foreign Application Priority Data
Mar. 19, 2020   (CN) .......................... 202020371418.4

(51) Int. Cl.
*H05K 5/02* (2006.01)
*G02F 1/1333* (2006.01)
*H05K 5/00* (2006.01)

(52) U.S. Cl.
CPC ..... *H05K 5/0247* (2013.01); *G02F 1/133314* (2021.01); *H05K 5/0052* (2013.01)

(58) Field of Classification Search
CPC ................ H05K 5/0247; H05K 5/0052; G02F 1/133314
See application file for complete search history.

(56) References Cited

U.S. PATENT DOCUMENTS 8,587,960 B2 * 11/2013 Hwang ..................... H05K 5/03
361/799
9,541,951 B2 * 1/2017 Kita .................. G02F 1/133308
2020/0045836 A1 2/2020 Wang

FOREIGN PATENT DOCUMENTS

CN    208093056 U    11/2018
CN    208093057 U    11/2018
(Continued)

OTHER PUBLICATIONS

PCT/CN2020/140594 International Search Report and Written Opinion.

*Primary Examiner* — Anthony Q Edwards
*Assistant Examiner* — Hung Q Dang
(74) *Attorney, Agent, or Firm* — IPro, PLLC

(57) ABSTRACT

The present disclosure relates to a rear housing of a display device comprising a first portion corresponding to a first region of a backboard of the display device and a second portion corresponding to a second region of the backboard of the display device; the first portion comprises a top wall which circumferentially surrounds an annular side wall having a notch, and the side wall is provided with a terminal hole corresponding to a connection terminal on a mainboard of the display device; the second portion is provided on a notch side of the first portion, and the second portion comprises a central portion corresponding to the notch of the first portion, and side portions on opposite sides of the central portion, the central portion is provided with a connection wall covering the notch, and the connection wall is provided with a terminal hole corresponding to a connection (Continued)

terminal on the mainboard of the display device. The present disclosure also relates to a display device.

16 Claims, 4 Drawing Sheets

(56) References Cited

FOREIGN PATENT DOCUMENTS

| | | |
|---|---|---|
| CN | 208094968 U | 11/2018 |
| CN | 208400414 U | 1/2019 |
| CN | 208691408 U | 4/2019 |
| CN | 110446381 A | 11/2019 |
| CN | 211016289 U | 7/2020 |

* cited by examiner

REAR HOUSING AND DISPLAY DEVICE HAVING THE SAME

CROSS-REFERENCE TO RELATED APPLICATIONS

The present application is the U.S. national phase of PCT Application No. PCT/CN2020/140594 filed on Dec. 29, 2020, which claims a priority of the Chinese patent application 202020371418.4 filed on Mar. 19, 2020, which are incorporated herein by reference in their entirety.

TECHNICAL FIELD

The present disclosure relates to the technical field of display product manufacturing, and more particularly to a rear housing of a display device and the display device.

BACKGROUND

The display device is generally composed of mainboard, adapter, baffle, screw and rear housing. The main function of the baffle is to lead out the connection terminals of the mainboard, so as to avoid direct contact between the mainboard and the outside, so that the main board only exposes the external interface. The baffle of the display device on the market is separate from the rear housing and the backboard, the baffle is fixed on the backboard, and the backboard needs to be provided with positioning holes and screw holes, so that the strength of the backboard is easily reduced, and the screw used for fixing the baffle is exposed to affect the appearance, and there is a risk of falling.

SUMMARY

In order to solve the above-mentioned technical problems, the present disclosure provides a rear housing of a display device and the display device, which solve the problems that a baffle for leading out a connection terminal of a mainboard is separately provided, resulting in a reduction in the strength of a backboard, and affecting the appearance, etc.

In order to achieve the above object, the present disclosure adopts the following technical solution: a rear housing of a display device including a first portion corresponding to a first region of a backboard of the display device and a second portion corresponding to a second region of the backboard of the display device; wherein the first portion includes a top wall which circumferentially surrounds an annular side wall having a notch, and the side wall is provided with a terminal hole corresponding to a connection terminal on a mainboard of the display device; and the second portion is provided on a notch side of the first portion, and the second portion includes a central portion corresponding to the notch of the first portion, and side portions on opposite sides of the central portion, the central portion is provided with a connection wall covering the notch, and the connection wall is provided with a terminal hole corresponding to a connection terminal on the mainboard of the display device.

Alternatively, the side wall is provided with a groove, a bottom surface of the groove is connected to the top wall, and the terminal hole is provided at the bottom surface of the groove.

Alternatively, each of the side portions is convex in a first direction, opposite side surfaces of both of the side portions are joined to the central portion and the connection wall to enclose a groove, the first direction is a direction from a side of the connection wall remote from the top wall to a side of the connection wall proximate to the top wall.

Alternatively, both of the side portions are symmetrically arranged with the central portion as the center, and a sound outlet hole is provided on an outer side surface adjacent to the side surfaces on each of the side portions.

Alternatively, the first portion is integrally injection molded and the second portion is integrally injection molded.

Alternatively, the first portion and the second portion are snap-fitted.

Alternatively, the side wall includes two first connection surfaces facing the second portion, each of the first connection surfaces being recessed to form a neck, and the second portion includes a second connection surface facing the first portion, the second connection surface being provided with a protrusion capable of being snapped into the neck.

The present disclosure further provides a display device, including:

mainboard provided with a connection terminal;
backboard including a first region for mounting the mainboard and a second region for mounting an electronic component; and
the rear housing mention above, which has a first portion snap-fitted over the first region to form a first receiving cavity for receiving a mainboard, and a second portion snap-fitted over the second region to form a second receiving cavity for receiving an electronic component.

Alternatively, the electronic component includes a speaker, each of the side portions of the second portion is convex in a first direction such that each of the side portions is snap-fitted with the backboard to form the second receiving cavity for receiving the speaker, and each of the side portions is provided with a sound outlet hole on an outer side surface remote from the first portion.

Alternatively, the backboard and the rear housing are fixed by bolts.

Advantageous effects of the present disclosure includes: a terminal hole is provided on a side wall of a first portion of the rear housing, and a terminal hole is provided on a connection wall of a second portion of the rear housing, namely, a baffle for leading out a connection terminal of a mainboard is integrated on the rear housing, positioning holes and screw holes on a backboard are reduced, the strength of the backboard is enhanced, and processing costs are reduced, manpower is saved, and efficiency is improved.

DETAILED DESCRIPTION

Figure 1:
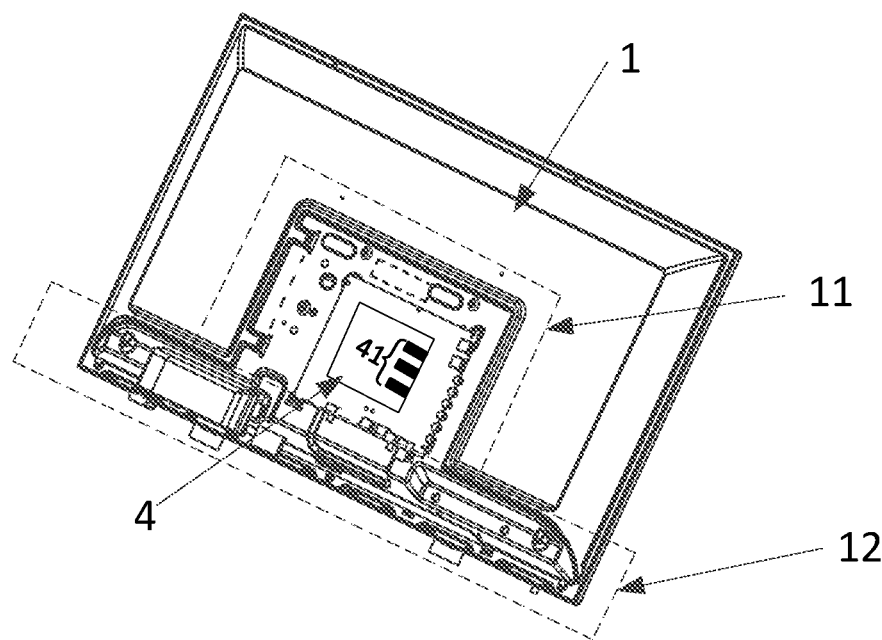
FIG. 1 shows a schematic structural view of a backboard in an embodiment of the present disclosure.

To further clarify the objects, technical solutions and advantages of the embodiments of the present disclosure, a more particular description of technical solutions of the embodiments of the present disclosure will be rendered by reference to the appended drawings. Obviously, the embodiments described in the present disclosure are part, but not all, of the disclosed embodiments. Based on the embodiments described in the present disclosure, all other embodiments obtained by a person of ordinary skill in the art are within the scope of protection of this disclosure.

In the description of the present disclosure, it should be understood that the orientation or positional relationship indicated by the terms "central", "upper", "lower", "left", "right", "vertical", "horizontal", "inner", "outer" and the like is based on the orientation or positional relationship shown in the drawings, and is merely for convenience of describing the disclosure and simplifying the description, but not intended or implied that the referenced device or element must have a particular orientation, be constructed and operated in a particular orientation, and thus should not be construed as limiting the present disclosure. Further, the terms "first", "second", "third" are used for descriptive purposes only and are not to be construed as indicating or implying relative importance.

The display device generally includes a mainboard, a backboard, a rear housing and a baffle, and the main function of the baffle is to lead out the connection terminal of the mainboard, so as to avoid direct contact between the mainboard and the outside, so that the main board only the external interface. The baffle of the display device is separately provided with the rear housing and the backboard, and when being assembled, the baffle and the backboard need to be positioned in advance, then fixed by screws, and then the rear housing is fixed on the backboard, the baffle is fixed on the backboard by screws, and the backboard needs to be provided with positioning holes and screw holes, so that the strength of the backboard is easily reduced, and the screws used for fixing the baffle are exposed to affect the appearance, and there is a risk of falling off.

In view of the above technical problem, the present embodiment provides a rear housing of a display device. Referring to FIGS. 1-6, the rear housing includes a first portion 2 corresponding to a first region 11 of a backboard 1 of the display device and a second portion 3 corresponding to a second region 12 of the backboard 1 of the display device.

The first portion 2 includes a top wall 21 which circumferentially encloses an annular side wall 22 having a notch, and the side wall 22 is provided with a terminal hole (a first terminal hole 221 in FIGS. 2 and 3) corresponding to a connection terminal 41 on a mainboard 4 of the display device.

The second portion 3 is provided on the notch side of the first portion 2, and the second portion 3 includes a central portion 32 corresponding to the notch of the first portion 2, and side portions 31 on opposite sides of the central portion 32, the central portion 32 is provided with connection walls 321 covering the notch, and the connection wall 321 is provided with a terminal hole (a second terminal hole 322 in FIG. 5) corresponding to a connection terminal 41 on the mainboard 4 of the display device.

The side wall 22 of the first portion 2 of the rear housing is provided with a first terminal hole 221, and the connection wall 321 of the second portion 3 of the rear housing is provided with a second terminal hole 322. Namely, a baffle for leading out a connection terminal 41 of a mainboard 4 is integrated on the rear housing with respect to a conventional solution of providing the baffles independently, positioning holes and screw holes on a backboard 1 are reduced, the strength of the backboard 1 is enhanced, the procedure of separately processing the baffle is reduced, thereby reducing the processing costs, and the steps of separately fixing the baffle to the backboard 1 are reduced, saving manpower and improving efficiency.

Specifically, the first portion 2 may include a top wall 21 and a side wall 22, wherein the top wall 21 may have a flat plate structure, may have a rectangular shape or may have an irregular shape. And after the rear housing is connected to the backboard 1, the top wall 21 is arranged opposite to and parallel to a mainboard 4 fixed to the backboard 1, and the side wall 22 is integrally formed with the top wall 21. And the side wall 22 and the top wall 21 enclose a receiving cavity, an open end of one side of the receiving cavity remote from the top wall 21 is covered by a backboard 1. A mainboard 4 is mounted on the backboard 1 and is located in the receiving cavity. Moreover, the side wall 22 has a notch, namely, the side wall 22 is not a complete ring structure, but is not a closed semi-ring structure, the side wall 22 has the notch on the side facing the second portion 3, the connection wall 321 of the central portion 32 of the second portion 3 just covering the notch.

The side wall 22 of the first portion 2 is provided with a first terminal hole 221, and the connection wall 321 of the central portion 32 of the second portion 3 is provided with a second terminal hole 322. The shape of the first terminal hole 221 and the second terminal hole 322 may be circular, rectangular, waisted, etc. depending on the shape of the connection terminal 41 of the mainboard 4. For example, when the cross-sectional shape of the connection terminal 41 of the mainboard 4 is circular, the shape of the corresponding terminal hole is also circular.

Note that the area of the terminal hole (including the first terminal hole and the second terminal hole) may be slightly larger than the cross-sectional area of the corresponding connection terminal 41 so that the corresponding connection terminal 41 sticks into or out of the terminal hole and is connected to other structures.

In this embodiment, a groove 224 is provided in the side wall 22, a bottom surface 222 of the groove 224 is connected to the top wall 21, and the first terminal hole 221 is provided in the bottom surface 222 of the groove 224.

Figure 2:
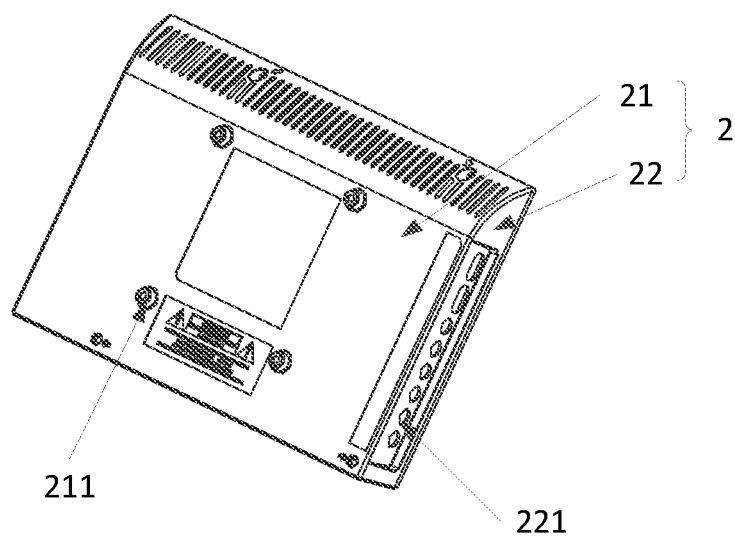
FIG. 2 shows a first schematic structural view of a first portion of a rear housing in an embodiment of the present disclosure.
Figure 3:
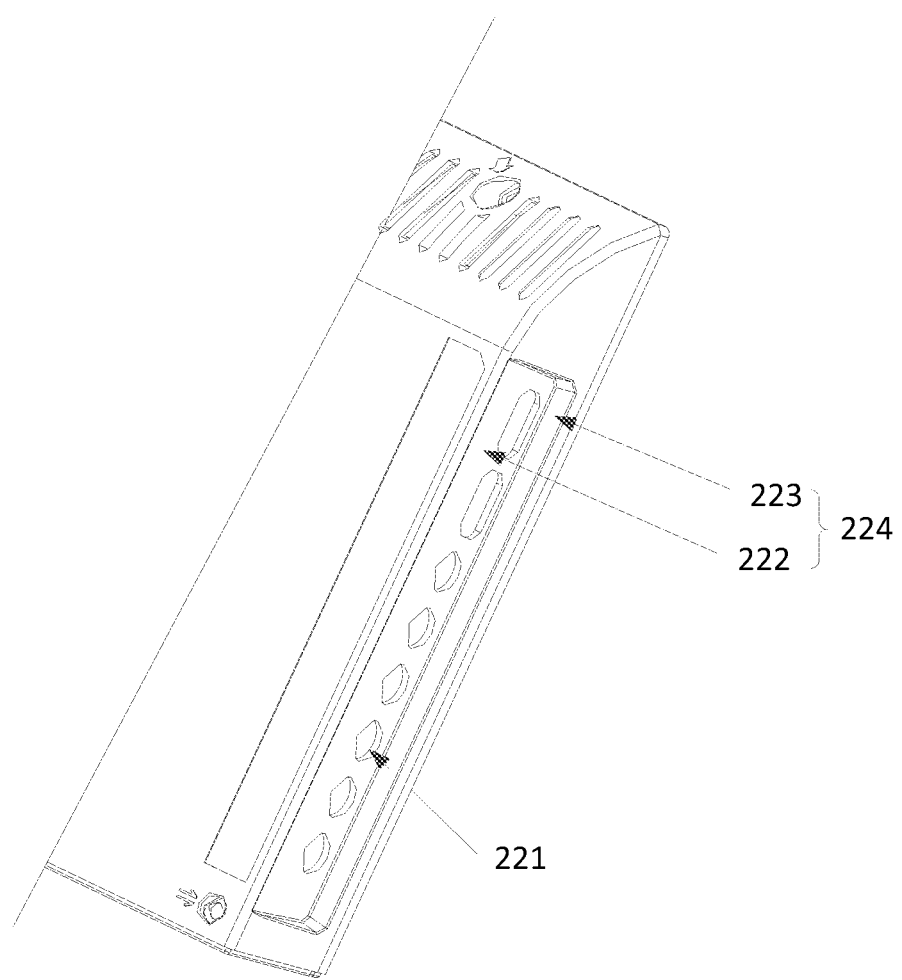
FIG. 3 shows a partial schematic view of FIG. 2.
Figure 4:
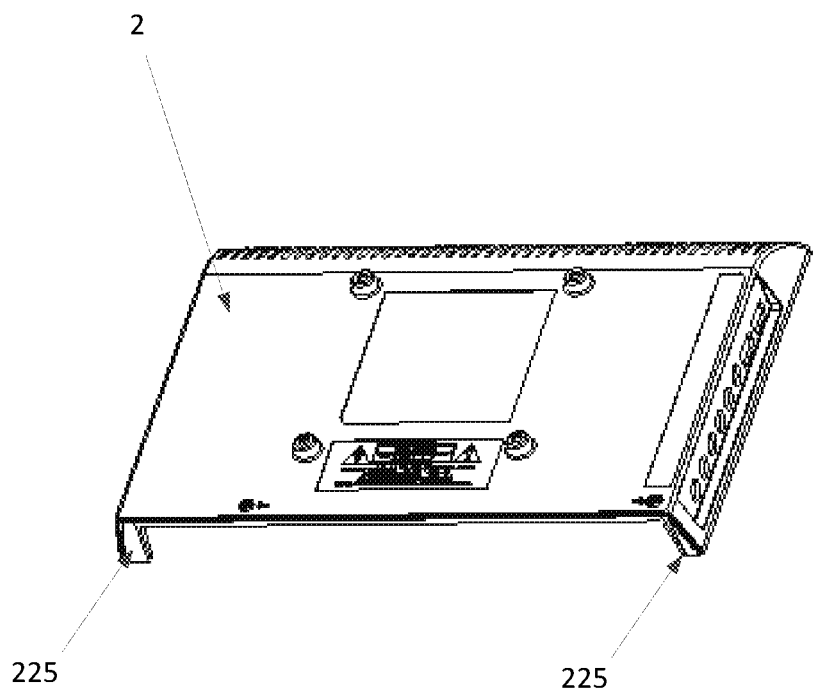
FIG. 4 shows a second schematic structural view of a first portion of a rear housing in an embodiment of the present disclosure.

When the connection terminal 41 on the mainboard sticks out of the terminal hole 221, and the connection terminal 41 is not protruded from the groove 224, thereby hiding the connection terminal 41 and preventing the connection terminal 41 from colliding with external structures. As shown in FIGS. 2 and 3, the groove 224 includes a bottom surface 222 and a side surface 223 connected to the bottom surface 222, the side surface 223 having a width in the depth direction of the groove 224 smaller than a length of a portion where the connection terminal 41 sticks out of the terminal hole and is exposed to the terminal hole.

Figure 5:
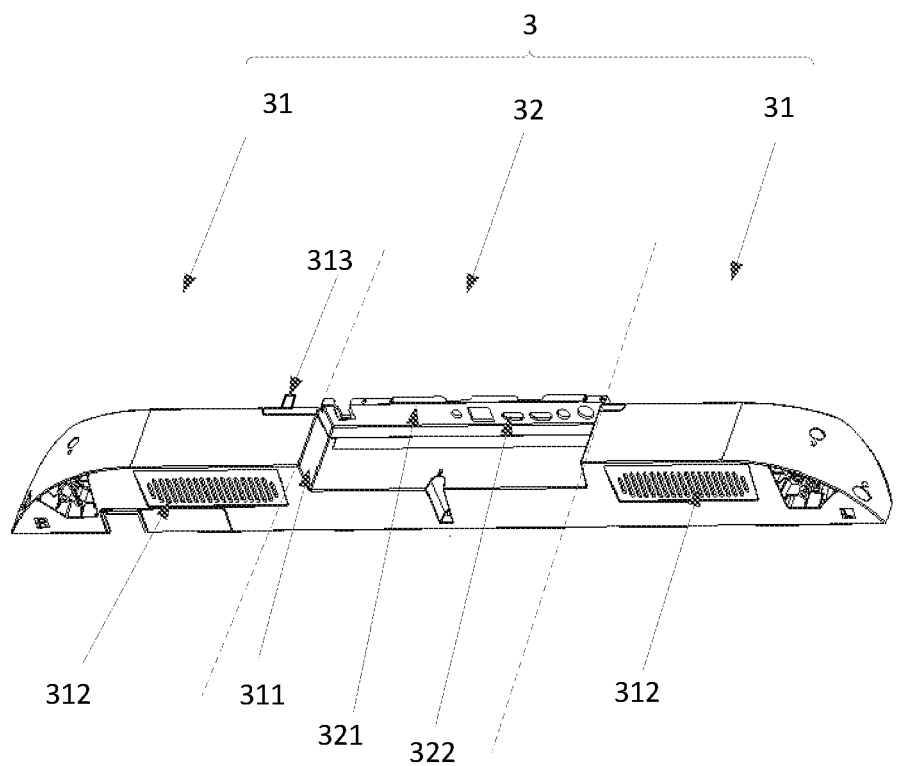
FIG. 5 shows a schematic structural view of a second portion of a rear housing in an embodiment of the present disclosure.
Figure 6:
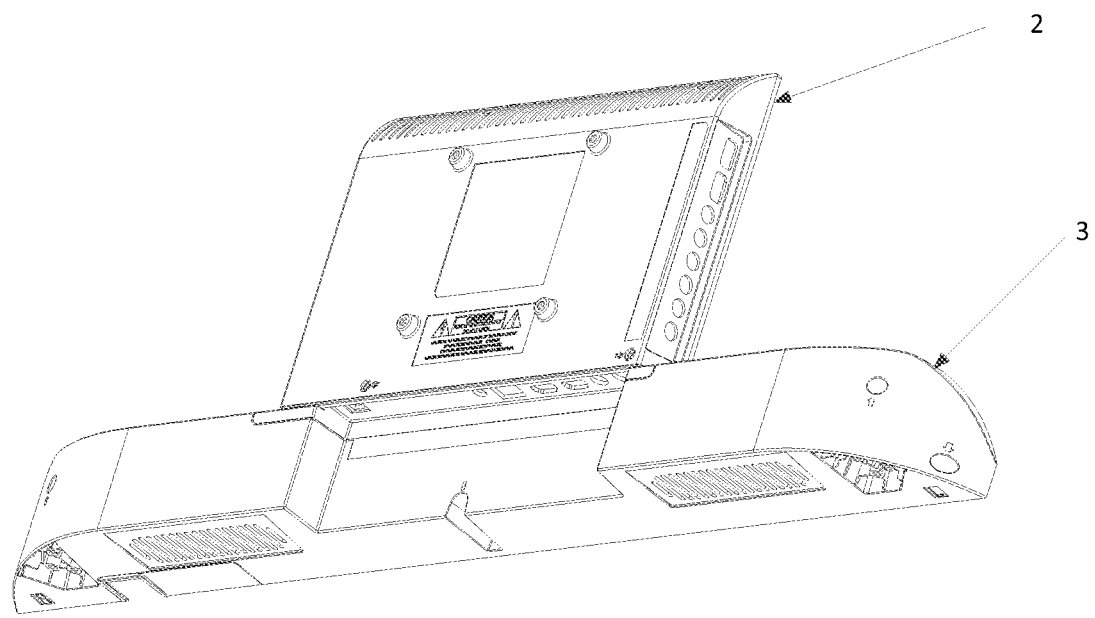
FIG. 6 shows a schematic structural view of a rear housing in an embodiment of the present disclosure.

In this embodiment, each of the side portions 31 is convex in a first direction, opposite side surfaces 311 of both of the side portions 31 are joined to the central portion 32 and the connection wall 321 to enclose a groove 224, the first direction is a direction from a side of the connection wall 321 remote from the top wall 21 to a side of the connection wall 321 proximate to the top wall 21, referring to FIGS. 5 and 6.

In order to receive the electronic components corresponding to the positions of the two side portions 31, the two side portions 31 are convex in a first direction, at this time, the central portion 32 becomes a concave portion, and the opposite side surfaces 311 of both of the two side portions 31 are joined to the central portion 32 and the connection wall 321 to enclose a groove 224. The connection wall 321 is provided at a side proximate to the first portion 2, when the connection terminal 41 on the mainboard 4 sticks out of the terminal hole 221 of the connection wall 321, the connection terminal 41 is located in the groove 224 and does not stick out of the groove 224, thereby hiding the connection terminal 41 and preventing the connection terminal 41 from colliding with external structures.

In this embodiment, the two side portions 31 are symmetrically arranged with the central portion 32 as the center, and the sound outlet hole 312 is provided on the outer side surface adjacent to the side surfaces on each of the side portions 31.

The two side portions 31 are symmetrically arranged with the central portion 32 as the center to beautify the appearance. When the electronic components provided at positions corresponding to the two side portions 31 are speakers, the sound outlet hole 312 is provided on the outer side surface adjacent to the side surfaces on each of the side portions 31.

In this embodiment, the first portion 2 is integrally injection molded and the second portion 3 is integrally injection molded.

In the related art, a baffle for leading out a connection terminal 41 of a mainboard 4 is composed of an SECC (Electrolytic Lead Galvanized Steel Plate) or an SGCC (Hot Dip Galvanized Steel Plate) material, increases the weight of the whole machine, is not easy to handle, and is costly. In this embodiment, the first portion 2 may be injection molded of a plastic material, and the second portion 3 may also be injection molded of a plastic material, that is, the rear housing may be a plastic rear housing, and the side wall 22 of the first portion 2 provided with the first terminal hole 221, and the connection wall 321 of the central portion 32 of the second portion 3 provided with the second terminal hole 322 is naturally also composed of a plastic material, which on the one hand can reduce the weight of the display device, and on the other hand can provide the rear housing with a certain elasticity to facilitate the assembly of the rear housing.

In this embodiment, the first portion 2 and the second portion 3 are clamped and fixed to each other to improve the assembly efficiency of the first portion 2 and the second portion 3.

In this embodiment, the side wall 22 includes two first connection surfaces facing the second portion 3, each of the first connection surfaces being recessed to form a neck 225, and the second portion 3 includes a second connection surface facing the first portion 2, the second connection surface being provided with a protrusion 313 capable of being snapped into the neck 225.

It should be noted that only the neck providing portion where the neck 225 is provided on the side wall 22 may be thickened to ensure that there is enough space on the side wall 22 to provide the neck 225, and the thickness of the other portion of the side wall 22 is smaller than the thickness of the neck providing portion to achieve weight reduction.

The present disclosure further provides a display device, including:
  mainboard 4 provided with a connection terminal 41;
  backboard 1 including a first region 11 for mounting the mainboard 4 and a second region 12 for mounting an electronic component; and
  the rear housing mention above, which has a first portion 2 snap-fitted over the first region 11 to form a first receiving cavity for receiving a mainboard 4, and a second portion 3 snap-fitted over the second region 12 to form a second receiving cavity for receiving an electronic component.

A terminal hole (referring to a first terminal hole 221 in FIGS. 2 and 3) is provided on a side wall of the first portion 2 of the rear housing, and a terminal hole (referring to a second terminal hole 322 in FIG. 5) is provided on a connection wall 321 of the second portion 3 of the rear housing, namely, a baffle for leading out a connection terminal 41 of a mainboard 4 is integrated on the rear housing, positioning holes and screw holes on a backboard 1 are reduced, the strength of the backboard 1 is enhanced, and processing costs are reduced, manpower is saved, and efficiency is improved.

In this embodiment, the electronic component includes a speaker, each of the side portions 31 of the second portion 3 is convex in a first direction such that each of the side portions 31 is snap-fitted with the backboard 1 to form the second receiving cavity for receiving the speaker, and each of the side portions 31 is provided with a sound outlet hole 312 on an outer side surface remote from the first portion 2.

In this embodiment, the backboard 1 and the rear housing are fixed by bolts 211.

The display device may be: any product or component having a display function, such as a liquid crystal television, a liquid crystal display, a digital photo frame, a mobile phone, a tablet computer, etc. And the display device further includes a flexible circuit board, a printed circuit board and a backboard 1.

The backboard 1 may be an iron backboard 1, that is, the backboard 1 may be made of an iron material to improve the heat dissipation efficiency of the backboard 1, and of course, the backboard 1 may also be made of other metal materials; the mainboard 4 may be mounted on the backboard 1, and the mainboard 4 is provided with connection terminals 41, the number of which may be one, two or more.

While the foregoing is directed to the preferred embodiments of the present disclosure, it will be understood by those skilled in the art that various modifications may be made without departing from the spirit and scope of the disclosure.

What is claimed is:

1. A rear housing of a display device, wherein the rear housing comprises a first portion corresponding to a first region of a backboard of the display device and a second portion corresponding to a second region of the backboard of the display device;
  the first portion comprises a top wall which circumferentially surrounds an annular side wall having a notch, and the annular side wall is provided with a terminal hole corresponding to a connection terminal on a mainboard of the display device; and
  the second portion is provided on a notch side of the first portion, and the second portion comprises a central portion corresponding to the notch of the first portion, and side portions on opposite sides of the central portion, the central portion is provided with a connection wall covering the notch, and the connection wall is provided with a terminal hole corresponding to a connection terminal on the mainboard of the display device;
  wherein the first portion and the second portion are snap-fitted;
  wherein the annular side wall comprises two first connection surfaces facing the second portion, each of the first connection surfaces being recessed to form a neck, and the second portion comprises a second connection surface facing the first portion, the second connection surface being provided with a protrusion capable of being snapped into the neck.

2. The rear housing of the display device according to claim 1, wherein a groove is provided on the annular side wall, a bottom surface of the groove is connected to the top wall, and the terminal hole is provided at the bottom surface of the groove.

3. The rear housing of the display device according to claim 1, wherein each of the side portions is convex in a first direction, opposite side surfaces of both of the side portions are joined to the central portion and the connection wall to enclose a groove, the first direction is a direction from a side of the connection wall remote from the top wall to a side of the connection wall proximate to the top wall.

4. The rear housing of a display device according to claim 1, wherein the first portion is integrally injection molded.

5. The rear housing of the display device according to claim 1, wherein the second portion is integrally injection molded.

6. The rear housing of the display device according to claim 3, wherein both of the side portions are symmetrically arranged with the central portion as a center.

7. The rear housing of the display device according to claim 6, wherein a sound outlet hole is provided on an outer side surface adjacent to the side surfaces on each of the side portions.

8. A display device comprising:
mainboard provided with a connection terminal;
backboard comprising a first region for mounting the mainboard and a second region for mounting an electronic component; and
a rear housing, wherein the rear housing comprises a first portion corresponding to the first region of the backboard of the display device and a second portion corresponding to the second region of the backboard of the display device;
the first portion comprises a top wall which circumferentially surrounds an annular side wall having a notch, and the annular side wall is provided with a terminal hole corresponding to a connection terminal on a mainboard of the display device; and
the second portion is provided on a notch side of the first portion, and the second portion comprises a central portion corresponding to the notch of the first portion, and side portions on opposite sides of the central portion, the central portion is provided with a connection wall covering the notch, and the connection wall is provided with a terminal hole corresponding to a connection terminal on the mainboard of the display device;

wherein the first portion is snap-fitted over the first region to form a first receiving cavity for receiving the mainboard, and the second portion is snap-fitted over the second region to form a second receiving cavity for receiving the electronic component;
wherein the first portion and the second portion are snap-fitted;
wherein the annular side wall comprises two first connection surfaces facing the second portion, each of the first connection surfaces being recessed to form a neck, and the second portion comprises a second connection surface facing the first portion, the second connection surface being provided with a protrusion capable of being snapped into the neck.

9. The display device according to claim 8 wherein the electronic component comprises a speaker, each of side portions of the second portion is convex in a first direction such that each of the side portions is snap-fitted with the backboard to form the second receiving cavity for receiving the speaker, and each of the side portions is provided with a sound outlet hole on an outer side surface remote from the first portion.

10. The display device according to claim 8, wherein the backboard and the rear housing are fixed by bolts.

11. The display device according to claim 8, wherein a groove is provided on the annular side wall, a bottom surface of the groove is connected to the top wall, and the terminal hole is provided at the bottom surface of the groove.

12. The display device according to claim 8, wherein each of the side portions is convex in a first direction, opposite side surfaces of both of the side portions are joined to the central portion and the connection wall to enclose a groove, the first direction is a direction from a side of the connection wall remote from the top wall to a side of the connection wall proximate to the top wall.

13. The display device according to claim 8, wherein the first portion is integrally injection molded.

14. The display device according to claim 8, wherein the display device includes a liquid crystal television, a liquid crystal display, a digital photo frame, a mobile phone, or a tablet computer.

15. The display device according to claim 8, wherein the display device further includes a flexible circuit board, a printed circuit board and a backboard.

16. The display device according to claim 12, wherein both of the side portions are symmetrically arranged with the central portion as a center.

* * * * *